United States Patent
Meyer

(10) Patent No.: US 7,697,636 B2
(45) Date of Patent: Apr. 13, 2010

(54) PROCESS FOR AUTOMATIC CORRECTION OF THE SPECTRAL INVERSION IN A DEMODULATOR AND DEVICE TO IMPLEMENT THE PROCESS

(75) Inventor: Jacques Meyer, Saint-Martin-Le-Vinoux (FR)

(73) Assignee: STMicroelectronics S.A., Montrouge (FR)

( * ) Notice: Subject to any disclaimer, the term of this patent is extended or adjusted under 35 U.S.C. 154(b) by 834 days.

(21) Appl. No.: 11/428,148

(22) Filed: Jun. 30, 2006

(65) Prior Publication Data

US 2007/0002975 A1    Jan. 4, 2007

(51) Int. Cl.
*H04L 27/14* (2006.01)
(52) U.S. Cl. .................................... 375/324
(58) Field of Classification Search .............. 375/324, 375/329, 343, 316, 259; 714/755; 341/51, 341/52
See application file for complete search history.

(56) References Cited

FOREIGN PATENT DOCUMENTS

| GB | 2282286 A | 3/1995 |
| WO | WO 01/86902 A1 | 11/2001 |

OTHER PUBLICATIONS

Extended European Search Report dated Dec. 5, 2006 for European Patent Application No. 06368011.0.

*Primary Examiner*—Khai Tran
(74) *Attorney, Agent, or Firm*—Lisa K. Jorgenson; Jon A. Gibbons; Fleit Gibbons Gutman Bongini & Bianco P.L.

(57) ABSTRACT

A process of correction of the spectral inversion for a receiver in a digital communication system: the process allows the reception in the receiver of a training sequence presumably known according to a modulation of type $\pi/2$ BPSK or MDP2. The process includes the following steps: Demodulating of the training sequence; Calculating of the differential correlation on a set of N received samples ($R_n$) and presumably sent ($S_n$) to generate a result; Using the result to detect the beginning of the frame and to order a spectral inversion in the chain of reception of the aforementioned receiver before launching the detection of the beginning of the frame. A receiver to process automatically the spectral inversion is also described.

16 Claims, 3 Drawing Sheets

PROCESS FOR AUTOMATIC CORRECTION OF THE SPECTRAL INVERSION IN A DEMODULATOR AND DEVICE TO IMPLEMENT THE PROCESS

CROSS-REFERENCE TO RELATED APPLICATIONS

This application is based upon and claims priority from prior French Patent Application No. 05 07040, filed on Jul. 1, 2005 the entire disclosure of which is herein incorporated by reference.

FIELD OF THE INVENTION

The present invention generally relates to the filed of digital transmissions and more specifically to a process of automatic correction of spectral inversion in a demodulator of a digital transmission system.

BACKGROUND OF THE INVENTION

Digital communications show a significant development with mobile telephony, new digital television standards, and satellite transmissions. The significant progress in that domain and the great diversity of operators have made information a "good" as easy to exchange as goods can be.

That great diversity of operators in the transmission chain has introduced the need, inside the decoder of the digital communication system, to detect, in addition to the classical parameters of time and phase synchronization, a supplementary parameter which is that of spectral inversion.

As known and illustrated in FIG. 1a, at the time of a demodulation, a receiver performs the mixing of the spectrum of the received signal with a carrier frequency (OL). Depending on whether that carrier is a frequency is below or above the spectrum of the frequency to be processed, an inversion of the spectrum can occur. FIG. 1a illustrates a typical situation where no spectral inversion is introduced.

FIG. 1b illustrates on the opposite a situation of FIG. 1a, wherein an inversion has occurred within the frequency spectrum. That inversion is not difficult to manage, especially when the spectrum of the signal to transmit is perfectly symmetric as is the case for an amplitude modulation.

On the other hand, when the modulation is more complex, a spectral inversion is a problem because data may not be detected. Using a phase locked loop mechanism, the detector is properly being locked on the carrier frequency. However, this does not permit data reception when a spectral inversion occurs.

The problem of spectral inversion needs to be corrected because, in today's digital telecommunications, multiple modulations/demodulations often times affect the signal transmission and reception, especially when various operators are involved on a same signal.

With this brief background, there are two possibilities to correct the spectral inversion: either by means of an inversion of the signal in quadrature, or by inverting both real and quadrature signals after a rotation of $\pi/2$.

One classical method to correct spectral inversion is with a software inversion of the channels in phase along with squaring of the demodulated signal. To this end, the classical receiver "presumes" during the processing of a received signal that this signal is not affected by an unspecified spectral inversion. If the detection fails while synchronized on the carrier, the receiver, after a certain period, concludes that a spectral inversion might have occurred and thus introduces a channel inversion in phase with squaring to re-establish the original spectrum.

This mechanism, which is universally used, is satisfactory up to a certain point, but has the disadvantage of introducing a blocking latency time in the processing of the demodulated signal for most modern applications.

Accordingly, what is needed is a method and system to to overcome the problems with the prior art spectral inversion by allowing a quasi-immediate detection of a spectral inversion in a received signal so as to guarantee the instantaneous processing.

SUMMARY OF THE INVENTION

The foregoing and other features and advantages of the present invention will be apparent from the following more particular description of the preferred embodiments of the invention, as illustrated in the accompanying drawings.

The present invention provides a method and system to achieve a process of automatic correction of the spectral inversion in a demodulator of a digital transmission system.

The present invention achieves a corrective process of the spectral inversion particularly fast, and is fitted to the $\pi/2$ BPSK modulation.

In one embodiment, the present invention provides a corrective process of the spectral inversion for a receiver in a digital communication system. The process allows the reception in the receiver of a presumably known sequence of training according to a modulation of type $\pi/2$ BPSK or MDP2 (modulation par déplacement de phase à 2 états). The process comprises the following steps:

Demodulation of the aforementioned sequence of training;
Calculation of differential correlation carried out in a window of N received samples ($R_n$) and N presumably sent samples ($S_n$);
Use of the correlation result to determine, at the same time, the detection of the beginning of the frame and a possible need of spectral inversion within the chain of digital reception.

Preferably, the module of the aforesaid result is compared to a threshold to determine the beginning of the frame and one tests the sign of the same result in order to control the occurrence of a spectral inversion in the chain of reception.

In a preferred embodiment, the process executes several modulations, one of which being a $\pi/2$ BPSK type modulation (or MDP2) in order to control a spectral inversion.

In a particular embodiment, the process is applied to a digital communication according to the DVBS2 (Digital Video Broadcasting Satellite) standard, comprising several blocks and symbols having different modulations, one of which being subject of a $\pi/2$ BPSK type modulation.

The present invention also provides a receiver for a digital communication system comprising a spectral inversion device, comprising:

means of reception of a presumably known sequence of training according to a $\pi/2$ BPSK or MDP2 type modulation;
means allowing to demodulate the aforementioned sequence of training;
means allowing a calculation of differential correlation on a set of N received samples ($R_n$) and presumably sent ($S_n$);
means to utilize the result of the aforementioned differential calculation in order to simultaneously determine the beginning of the frame as well as to control activation of a spectral inversion in the chain of reception.

Preferably, the absolute value of the real part of the result is used for computing the beginning block of the frame and the sign of that same real part of the result serves for controlling a spectral inversion within the chain of reception.

The invention is particularly adapted to the realization of a receiver including a demodulator and of a reception system according to the DVBS2 standard, or any norm utilizing blocks and symbols transmitted according to distinct modulations, such as the π/2 BPSK modulation type.

BRIEF DESCRIPTION OF THE DRAWINGS

The subject matter, which is regarded as the invention, is particularly pointed out and distinctly claimed in the claims at the conclusion of the specification. Other characteristics, goals and advantages of the invention will be apparent when reading the description taken in conjunction with the accompanying drawings here after, provided only as non restrictive examples:

DESCRIPTION OF THE PREFERRED EMBODIMENTS

Figure 1A:
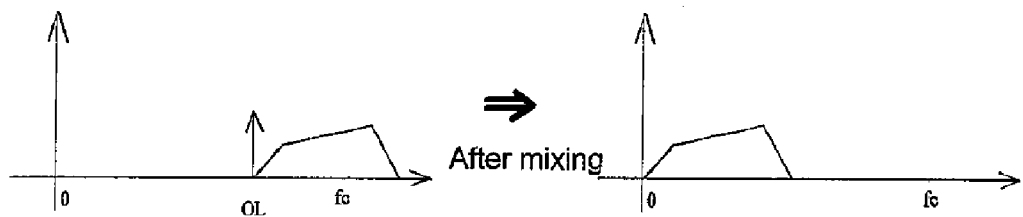
FIG. 1a illustrates a signal demodulation by a carrier (OL) in which there is no spectral inversion.
Figure 1B:
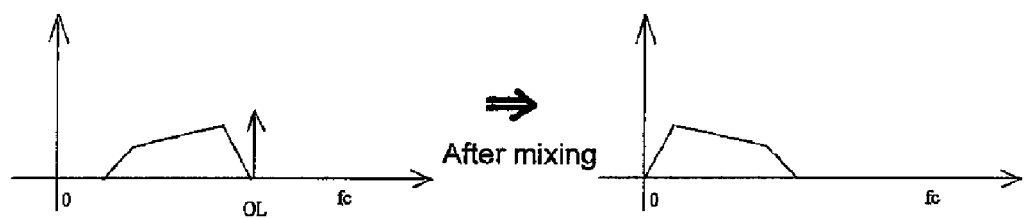
FIG. 1b illustrates the opposite a situation of FIG. 1a; here, an inversion has occurred within the frequency spectrum.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips.

The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

The process of correction of the spectral inversion is based on the utilization of a training sequence—comprising a presumably known sequence $S_0$, $S_1$, $S_2$, $S_3$—in combination with a Binary Phase Shift Keying (BPSK) modulation. As known in the art, in BPSK modulation, the constellation is made of two points 1 and −1 only. In accordance with the present invention, one utilises more particularly the π/2 BPSK version of that modulation wherein the symbols of even rows are transmitted on the carrier in phase while symbols of odd rows are transmitted on the carrier in quadrature. That modulation has the advantage of uniformly distributing the energy through the two channels, in phase and in quadrature, that ensures a better transmission in certain cases, particularly through non linear amplifiers of communication satellites.

It should be noted that, in a preferred embodiment, the π/2 BPSK type modulation is applied to only a part of the processed information, being understood that another part of information could be subject to different modulations. Those skilled in the art will clearly adapt the teaching of the present invention to any alternative combination of modulations, even when the π/2 BPSK type modulation is applied to the overall signal to transmit/receive.

Figure 2:
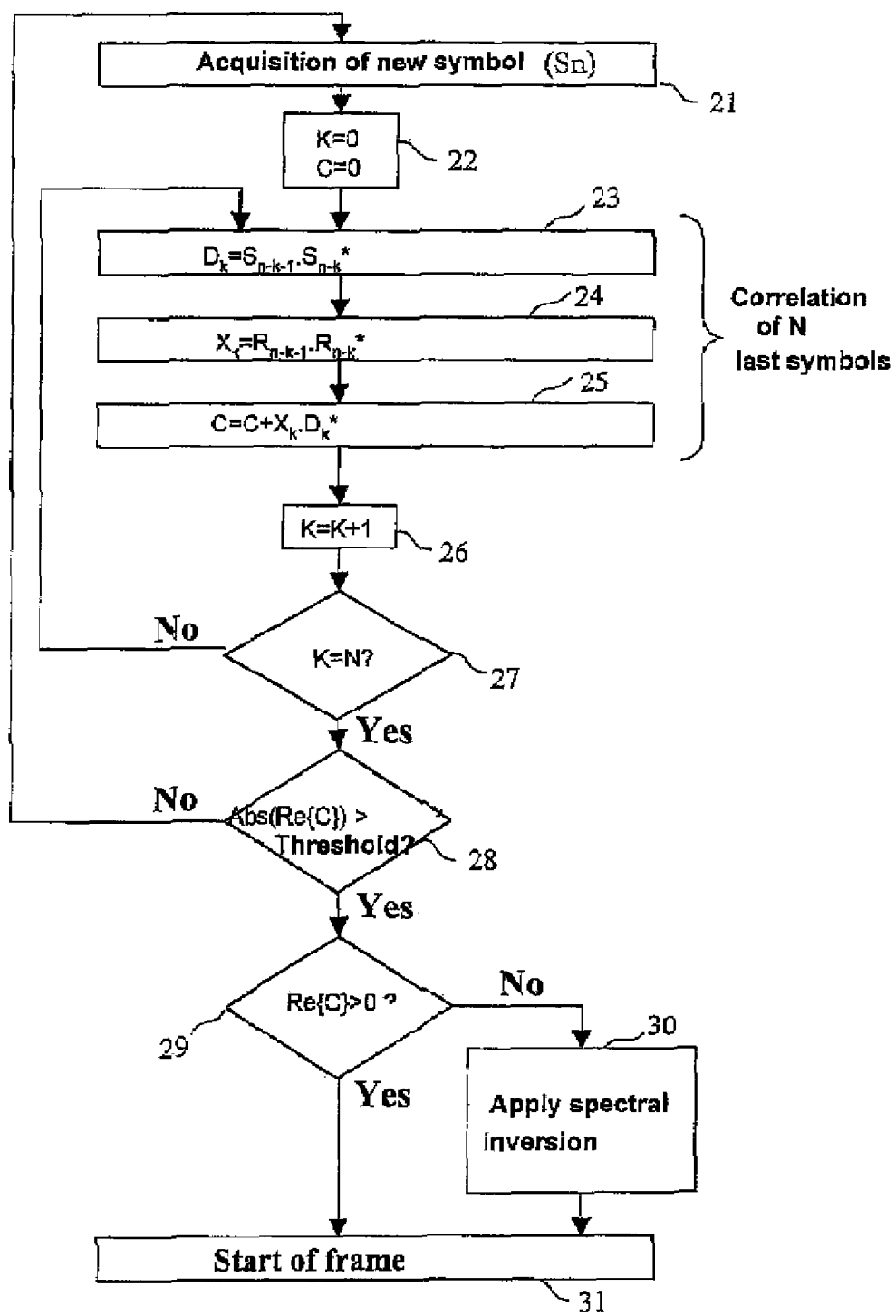
FIG. 2 represents a process of correction of a spectral inversion according to the present invention.

FIG. 2 shows a process of correction according to the invention which is applied in a receiver. The process is based on the use of a training sequence being received and processed by a receiver carrying out the following process:

In step 21, the process according to the invention calculates a differential symbol $D_n$ calculated as follows from two consecutive symbols transmitted $S_n$ and $S_{n+1}$:

$$D_n = S_n \cdot S_{n+1}^*$$

Step 22 is an initialization of iteration parameters k and C, which are set to 0.

The process then proceeds with an iterative loop comprising steps 23 and 26, wherein there are successively computed a differential symbol of emission $D_k$, a differential symbol of reception Xk as well as the result of a corresponding correlation computing.

To achieve this, the process carries out in a step 23 the calculation of a differential symbol of emission $D_k$ from two consecutive symbols of emission $D_{n-k-1}$ and $D_{n-k}$ for the considered value of k.

Then, in a step 24, the process according to the invention calculates a differential symbol $X_n$ from two consecutive symbols received $R_{n-k-1}$ and $R_{n-k}$ $$X_n = R_{n-k-1} \cdot R_{n-k}^*$$

In a step 25, the process multiplies the values $X_k$ and $D_k$ which were calculated previously and adds the product to variable C:

$$C = C + X_k \cdot D_k^*$$

Thus, the calculation of step 25 results in a calculation of differential correlation based on a window of N samples $X_0 \ldots X_{N-1}$ and N samples $D_0 \ldots D_{N-1}$ as follows:

$$C = \sum_{k=0}^{N-1} X_k \cdot D_k^*$$

In a step 26, the process reiterates the variable k and, in a step 27 a test is performed to determine if k=N, which would reveal the completion of the calculation of correlation on the N last values.

If k is different from N in step 27, the process proceeds with a new calculation reiterating steps 23-27. In the opposite case, when k=N, then the process continues with step 28 where the process tests the result of the preceding calculation and compares the absolute value of the result of step 25 with a predetermined threshold. It should be noted that the threshold is set in a classical way to allow the detection of the beginning of the frame in a receiver of digital communications. This is why setting that threshold will not be developed here.

If the module (or the absolute value of the real part) does not reach the predetermined threshold, then the process proceeds back to step 21 for the purpose of processing a new set of symbols.

In the case where the absolute value of the real part of the result is greater than the predetermined threshold, then the process proceeds with step 29 where the sign of the real part of the result of the differential correlation is being tested.

If the sign is positive, the process then proceeds further with step 31 which is the starting of the detector on the beginning of the frame.

If the sign is negative, the process continues with a step 30 where, without having to wait for the expiration of a certain latency time, a spectral inversion is applied within the reception chain. It should be noticed that the application of the spectral inversion is performed in a known way and which will be able to utilize, according to the case, either a software way or a hardware way.

The process continues then with step 31 of the launching of the start or beginning of the frame.

It can thus be seen that the method of the invention allows processing at the same time a received signal that has undergone a spectral inversion in the transmission chain as well as received signal exempt from such inversion. In the case of a modulation type π/2 BPSK, the sign can be directly and advantageously used for the purpose of immediately introducing a spectral inversion at the same time as the detector is started on the start of the frame.

This results in a significant advantage: a negligible processing time for introducing a spectral inversion which required, in the known techniques, the restarting of the receiver after a predefined latency time. With the invention, the calculation of the differential correlation carried out allows immediately, and without knowing <<a priori>> the existence or not of a spectral inversion at the time when we start the calculation of the differential correlation, to launch the detector on the beginning of the frame.

This instantaneous process of spectral inversion shows to be particularly useful. It is noted that the differential symbols are:

$D_{2k}=(b_{2k})\cdot(jb_{2k+1})^*=-jb_{2k}\cdot b_{2k+1}$ (where b are real parts)

D being a pure imaginary number, we notice then that $D^* = -D$

It can thus be seen that, when a spectral inversion appears in the transmission chain, the calculation of correlation performed a step 25 leads to a result C' which simply corresponds to the opposite of the combined result obtained without spectral inversion, as shown in the formula:

$$C' = \sum_{k=0}^{N-1} X_k^* \cdot D_k^* = -\sum_{k=0}^{N-1} X_k^* \cdot D_k = -C*$$

In the hypothesis of a π/2 BPSK modulation, it is not necessary to reiterate a new calculation of correlation. The result can be directly used, in the two situations, to launch the detection of the beginning of the frame or screen.

The described process can be implemented in various ways, and in particular in a pure software way.

The process can be advantageously used in the case of a communication according to the new DVBS2 (Digital Video Broadcasting Satellite) standard which will be used in Europe for the video transmission by satellite. According to this standard, the received signal is a succession of blocks of symbols having distinct lengths and modulations. At the beginning of each transmitted block, a heading is transmitted to define the format of symbols which follow. The decoding of that heading is essential to guarantee the good reception of the following blocks. It is made of 90 symbols, of which 26 comprise a known information (SOF=start of frame), and 64 supplementary symbols (PLS=Physical Layer Structure) coding 7 bits, that is to say 128 possible words, of which the structure allows to increase the reliability of the detection of the beginning of the frame.

The 64 symbols of PLS avoids wrong starts. In the preferred embodiment, the process is applied on the 26 symbols of SOF and we compare the absolute value of the result to a predefined threshold to determine the start of the frame as well as the sign of spectral inversion. Clearly, it is nothing more than a mode of realization and one of average skill in the art will be able to run other supplementary well known tests to limit wrong starts. It should be noted that, in certain cases, the coding of PLS is known at least partially, which allows to increase the number of known differential symbols (if we know the information <<pilot>> of DVBS2, we can utilise 32 symbols moreover).

According to the DVBS2 standard, those 90 bits are subject to a π/2 BPSK type modulation.

It can be seen that, with the new standard of video teledifusion by satellite, it will be possible to judiciously take advantage of the process of correction of spectral inversion by applying this process to the modulated heading according to the π/2 BPSK modulation.

This is, however, only one of the many possibilities of the invention.

Figure 3:
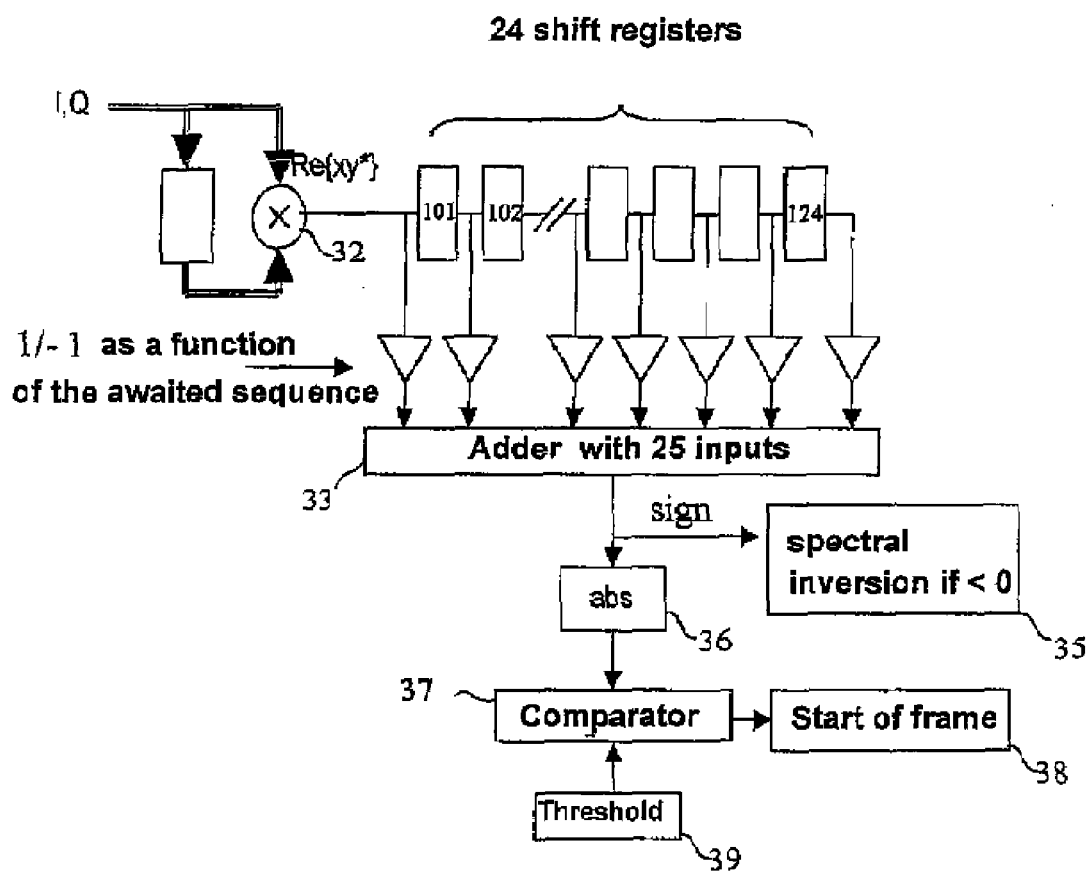
FIG. 3 illustrates a mode of realization of a device for carrying out the process of the invention.

FIG. 3 illustrates an embodiment which is based on a set of 24 shift registers 101-124 receiving the real part Re (xy*) of the received signal in output of a multiplier 32. Each output is then inverted or not according to the differential sequence emitted. Entries 33 into the adder 25 generates a sum of those values and to transmit them to a block 36 allowing to generate the absolute value of the result.

Results from blocks 36 are compared to a threshold 39 by means of a comparator block 37 in order to allow the detection of the beginning of the frame by the detector 38.

As can be seen in FIG. 3, the sign of calculation carried out by block 35 for detecting the spectral inversion and to correct it immediately.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A process for correction of spectral inversion in a digital communication system, the process comprising:
   demodulating, in a receiver, a training sequence being received;
   calculating, in the receiver, a differential correlation on a set of N received samples and N presumably sent samples to generate a result; and
   detecting, in the receiver, a frame and a sign of the result, and using a value of the sign of the result to control a spectral inversion in a reception sequence by using the differential correlation.

2. The process according to claim 1, wherein the training sequence is at least one of:
   µ/2BPSK (binary phase shift keying) modulations type; and
   MDP2 (modulation par déplacement de phase à 2 états) modulations type.

3. The process according to claim 1, further comprising:
   calculating an absolute value of a real part of the result of the differential correlation in order to determine a start of the frame; and
   testing the sign of the real part of the result in order to control the spectral inversion in the reception sequence.

4. The process according to claim 2, wherein the modulation type is applied to a portion of the reception sequence and another type of modulation for a subsequent sequence.

5. The process according to claim 3, wherein a first modulation type is applied to a portion of the reception sequence and second type of modulation for a subsequent sequence.

6. The process according to claim 5, wherein the modulation type is applied to a portion of the reception sequence compatible with a DVBS2 (Digital Video Broadcasting Satellite) standard in which several blocks and symbols having different types of modulations, including a portion using the µ/2 BPSK modulation type.

7. The process according to claim 6, wherein a heading comprises a set of 90 symbols of which at least 26 are transmitted via the modulation of type µ/2 BPSK.

8. The process according to claim 1, wherein calculating a differential correlation on the set of N received samples for a differential symbol of emission $D_k$ and a differential symbol of reception $X_k$ is given by variable C as follows:

$$C = \sum_{k=0}^{N-1} X_k \cdot D_k^*.$$

9. A receiver comprising:
   a demodulator for demodulating a training sequence being received;
   means for calculating a differential correlation on a set of N received samples and N presumably sent samples to generate a result;
   means for detecting a frame and a sign of the result in order to control a spectral inversion in a reception sequence by using the differential correlation;
   means for calculating an absolute value of a real part of the result of the differential correlation in order to determine a start of the frame; and
   means for testing the sign of the real part of the result in order to control the spectral inversion in the reception sequence.

10. The receiver according to claim 9, wherein the training sequence is at least one of:
    µ/2 BPSK (binary phase shift keying) modulations type; and
    MDP2 (modulation par déplacement de phase à 2 états) modulations type.

11. The receiver according to claim 9, wherein the modulation type is applied to a portion of the reception sequence and another type of modulation for a subsequent sequence.

12. The receiver according to claim 9, wherein a modulation type is applied to a portion of the reception sequence and another type of modulation for a subsequent sequence.

13. The receiver according to claim 12, wherein the modulation type is applied to a portion of the reception sequence compatible with a DVBS2 (Digital Video Broadcasting Satellite) standard in which several blocks and symbols having different types of modulations, including a portion using the µ/2 BPSK modulation type.

14. The receiver according to claim 13, wherein a heading comprises a set of 90 symbols of which at least 26 are transmitted via the modulation of type µ/2 BPSK.

15. The receiver according to claim 9, wherein calculating a differential correlation on the set of N received samples for a differential symbol of emission $D_k$ and a differential symbol of reception $X_k$ is given by variable C as follows:

$$C = \sum_{k=0}^{N-1} X_k \cdot D_k^*.$$

16. A digital communication system comprising a receiver equipped with a spectral inversion device, comprising:
    means for demodulating a training sequence being received with a MDP2 (modulation par déplacement de phase à 2 états) modulations type;
    means for calculating a differential correlation on a set of N received samples and N presumably sent samples to generate a result; and
    means for detecting a frame, and using a value of the sign of the result to control a spectral inversion in a reception sequence by using the differential correlation.

* * * * *